(12) United States Patent
Carter (10) Patent No.: US 9,573,809 B2
(45) Date of Patent: Feb. 21, 2017

(54) METHOD OF FORMING A METAL CHALCOGENIDE MATERIAL AND METHODS OF FORMING MEMORY CELLS INCLUDING SAME

(75) Inventor: Chet E. Carter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 405 days.

(21) Appl. No.: 13/435,216

(22) Filed: Mar. 30, 2012

(65) Prior Publication Data

US 2013/0260527 A1 Oct. 3, 2013

(51) Int. Cl.
*H01L 45/00* (2006.01)
*C01B 17/20* (2006.01)
*C01B 19/04* (2006.01)
*H01L 21/02* (2006.01)

(52) U.S. Cl.
CPC ............ *C01B 19/04* (2013.01); *C01B 17/20* (2013.01); *H01L 21/02568* (2013.01); *H01L 21/02614* (2013.01); *H01L 45/085* (2013.01); *H01L 45/1233* (2013.01); *H01L 45/144* (2013.01); *H01L 45/1633* (2013.01); *H01L 45/1683* (2013.01)

(58) Field of Classification Search
CPC ...... C01B 19/008; C01B 19/007; C01B 19/02; C01B 19/04; H01L 21/02568; H01L 21/02614; H01L 45/085; H01L 45/1233; H01L 45/144; H01L 45/1633; H01L 45/1683
See application file for complete search history.

(56) References Cited

U.S. PATENT DOCUMENTS

| | | | |
|---|---|---|---|
| 4,642,140 A * | 2/1987 | Noufi | C23C 22/48 |
| | | | 136/260 |
| 6,849,868 B2 * | 2/2005 | Campbell | H01L 45/085 |
| | | | 257/2 |
| 7,504,730 B2 * | 3/2009 | Harshfield | H01L 29/45 |
| | | | 257/774 |
| 7,573,133 B2 | 8/2009 | Cohen | |
| 7,687,709 B2 | 3/2010 | Cunningham et al. | |
| 7,709,958 B2 | 5/2010 | Cohen | |
| 7,892,413 B2 | 2/2011 | Aksu et al. | |
| 8,053,861 B2 | 11/2011 | Mountsier et al. | |
| 8,263,960 B2 * | 9/2012 | Lung et al. | 257/3 |
| 2003/0224249 A1 * | 12/2003 | Gorchkov | H01M 4/02 |
| | | | 429/218.1 |
| 2004/0118698 A1 | 6/2004 | Lu | |
| 2006/0042651 A1 * | 3/2006 | Verhaverbeke et al. | 134/1 |
| 2006/0284158 A1 | 12/2006 | Lung et al. | |

(Continued)

OTHER PUBLICATIONS

Walters, Charles, Mallory Components Limited, Cathode Electrode for an electrical device and method. Canada patent CA 1041620. 781031.*

(Continued)

*Primary Examiner* — Mark Tornow
*Assistant Examiner* — Priya Rampersaud
(74) *Attorney, Agent, or Firm* — TraskBritt (57) ABSTRACT

A method of forming a metal chalcogenide material. The method comprises exposing a metal to a solution comprising a chalcogenide element source compound and an acid. Methods of forming memory cells including the metal chalcogenide material are also disclosed.

18 Claims, 6 Drawing Sheets

(56) References Cited

U.S. PATENT DOCUMENTS

| | | |
|---|---|---|
| 2007/0105285 A1 | 5/2007 | Kusumoto et al. |
| 2009/0085095 A1 | 4/2009 | Kamath et al. |
| 2010/0135060 A1 | 6/2010 | Aratani et al. |
| 2010/0329967 A1* | 12/2010 | Lu .................. C01B 19/002 423/508 |
| 2011/0081487 A1 | 4/2011 | Bollman et al. |
| 2012/0288987 A1* | 11/2012 | Radu .................. B82Y 30/00 438/95 |

OTHER PUBLICATIONS

Tellurium Chloride Material Safety Data Sheet, ESPI Metals, Jan. 1996, 4 pages.
"Over" Definition, http://www.oxforddictionaries.com/us/definition/american_english/over, last visited Mar. 2016, 1 page.

* cited by examiner

METHOD OF FORMING A METAL CHALCOGENIDE MATERIAL AND METHODS OF FORMING MEMORY CELLS INCLUDING SAME

FIELD

The present disclosure, in various embodiments, relates generally to the field of semiconductor device design and fabrication. More specifically, the present disclosure relates to a method of forming a metal chalcogenide material, such as copper telluride (CuTe), and methods of forming memory cells including the metal chalcogenide material.

BACKGROUND

Over the past few decades, there has been interest in chalcogenide materials for use in semiconductor devices, such as solar cells, photodetectors, or electroconductive electrodes. One such chalcogenide material is copper telluride (CuTe), which has been investigated for use as a cell material in conductive bridge random access memory (CBRAM) and phase change random access memory (PCRAM). One of the difficulties associated with using CuTe is the deposition of the material. CuTe is conventionally formed by a physical vapor deposition (PVD) or chemical vapor deposition (CVD) process or by codeposition of copper and tellurium onto a surface within an evacuated chamber. However, due to the equipment and targets needed, these techniques are expensive and take a considerable amount of time to become production worthy.

It is would be desirable to form chalcogenide materials, such as CuTe, in a less costly and less complex manner.

DETAILED DESCRIPTION

Methods of forming a metal chalcogenide material using a solution-based process are described. To form the metal chalcogenide material, a chalcogenide element is incorporated into a metal by exposing the metal to a solution including a chalcogenide element source compound and an acid. The acid in the solution may activate the metal, enabling the metal to react with the chalcogenide element and form the metal chalcogenide material. The metal may be formed on a substrate. The chalcogenide element may be incorporated into the metal without co-depositing the chalcogenide element in additional materials surrounding the metal. By using the solution, the metal chalcogenide material may be formed by an immersion process rather than by a vacuum based process, such as PVD.

The following description provides specific details, such as material types and processing conditions in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

The illustrations presented herein are not meant to be actual views of any particular semiconductor structure, but are merely idealized representations which are employed to describe the present invention. The figures are not necessarily drawn to scale. Additionally, elements common between figures may retain the same numerical designation.

The materials described herein may be formed by any suitable technique including, but not limited to, spin-coating, blanket coating, CVD, atomic layer deposition (ALD), plasma enhanced ALD, PVD, or electrochemical techniques, unless otherwise specified. Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

As used herein, the term "metal" means and includes a metallic element of the periodic table of the elements in which the reduction potential of the metallic element is lower than that of the chalcogenide element of the chalcogenide element source compound. In some embodiments, the metal is a Group 11 element, such as copper, silver, or gold. In some embodiments, the metal is copper.

As used herein, the term "chalcogenide element" means and includes an element in Group 16 (also known as Group VIA) of the periodic table of the elements, such as oxygen, sulfur, selenium, tellurium, or polonium. In some embodiments, the chalcogenide element is tellurium.

The metal chalcogenide material may be a binary compound, a ternary compound, or a quaternary compound, such as a metal-chalcogenide compound including, but not limited to, copper sulfide (CuS), copper selenide (CuSe), copper telluride (CuTe), silver sulfide (AgS), silver selenide (AgSe), silver telluride (AgTe), gold sulfide (AuS), gold selenide (AuSe), or gold telluride (AuTe).

The metal of the metal chalcogenide material and the chalcogen of the metal chalcogenide material may be selected based on the difference in redox potential between the metal and the chalcogenide element. The metal and the chalcogenide element may be selected such that a difference in reduction potential between the two may be sufficient to overcome an activation barrier between the metal and the chalcogenide element. In some embodiments, the metal chalcogenide material is CuTe. As used herein, the term "CuTe" means and includes a stoichiometric or non-stoichiometric compound of copper and tellurium having the empirical formula $Cu_{100-x}Te_x$, where x is a real number greater than or equal to about 2, such as from about 2 to about 40. The CuTe may include, but is not limited to, CuTe, $CuTe_4$, $Cu_2Te$, $Cu_3Te_2$, $Cu_4Te_3$, $Cu_7Te_4$, or $Cu_7Te_5$. The stoichiometry of the metal chalcogenide material may be controlled by adjusting various process conditions including, but not limited to, concentration of the chalcogenide element source compound in the solution, concentration of the acid in the solution, temperature, pressure, and exposure time of the chalcogenide element source compound in the solution. The amount of chalcogenide element in the metal chalcogenide material may be increased by increasing the exposure time to the solution or by increasing the concentration of the chalcogenide element in the solution, the process temperature, or the process pressure.

The solution may be an aqueous solution including the chalcogenide element source compound and the acid. The solution may also include methanol or ethanol in combination with, or instead of, water. The chalcogenide element source compound may be at least partially soluble in the solution. The chalcogenide element source compound may be a solid, a liquid, or a gas. To achieve the greatest amount of the chalcogenide element in the metal chalcogenide material, the solution may include the chalcogenide element source compound at its upper solubility limit. The chalcogenide element source compound may be at least one of an oxide, sulfate, sulfide, chloride, acetate, nitrate, sulfamate, carbonate, phosphate, perchlorate, perchloride, or other salt of sulfur, selenium, tellurium, or polonium so long as the chalcogenide element source compound is at least partially soluble in the solution. In some embodiments, the chalcogenide element source compound is tellurium dioxide ($TeO_2$), tellurium trioxide ($TeO_3$), tellurium tetrachloride ($TeCl_4$), sulfur dioxide ($SO_2$), selenium dioxide ($SeO_2$), or selenium trioxide ($SeO_3$).

The acid may be a strong acid including, but not limited to, hydrochloric acid (HCl), sulfuric acid ($H_2SO_4$), hydrogen fluoride (HF), hydrogen iodide (HI), hydrogen bromide (HBr), perchloric acid ($HClO_4$), nitric acid ($HNO_3$), chloric acid ($HClO_3$), or combinations thereof. Other acids may also be used alone or in combination with one of the above-mentioned acids. In some embodiments, the acid is HCl. In another embodiment, the acid is $H_2SO_4$. In another embodiment, the acid includes a combination of HCl and $H_2SO_4$. Due to the presence of the acid in the solution, the solution may be characterized as an "activated plating solution."

The solution may have a pH of less than or equal to approximately 7.0, such as from approximately 0 to approximately 7.0, from approximately 0 to approximately 5.0, from approximately 0 to approximately 3.0, or from approximately 1.0 to approximately 3.0. The concentration of acid in the solution may be adjusted to achieve a pH within this range. The concentration of acid in the solution may depend on the acid selected and desired pH of the solution. The presence of the acid may increase the solubility of the chalcogenide element source compound in the solution. Due to the acidic pH, the solution may include ions of the chalcogenide element. Without being bound by any theory, the acid may also change a surface state of the metal. For instance, the acid may remove an oxide of the metal from a surface of a metal feature formed from the metal. Alternatively, any oxide of the metal may be removed from the surface of the metal feature by conventional techniques, such as by a sputter etch, before exposing the metal feature to the solution. The solution may be formed by adding the chalcogenide element source compound and the acid to water, with stirring, so that the chalcogenide element source compound is at least partially dissolved. In some embodiments, the chalcogenide element source compound is substantially dissolved in the solution. The water used in the solution may be of a high purity, such as deionized (DI) water.

The metal chalcogenide material may be formed by exposing the metal present on the substrate to the solution. The metal may be formed from a substantially pure metal. As used herein, the term "substrate" means and includes a base material or construction upon which additional materials are formed. The substrate may be a semiconductor substrate, a base semiconductor on a supporting structure, a metal electrode, or a semiconductor substrate having one or more materials, structures, or regions formed thereon. The substrate may be a conventional silicon substrate or other bulk substrate comprising semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. The metal chalcogenide material may be formed on any other substrates upon which metal chalcogenide materials are desired.

Figure 1A:
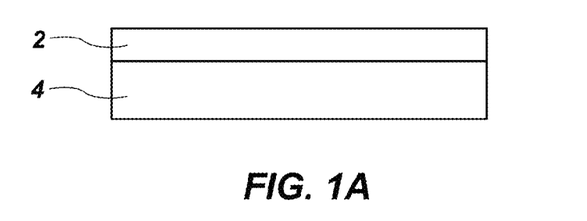
FIGS. 1A-1C illustrate an embodiment of a method of forming a metal chalcogenide material according to the present disclosure.
Figure 1B:
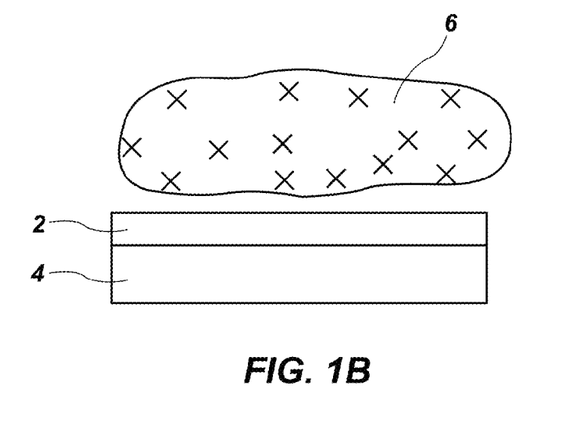
Figure 1C:
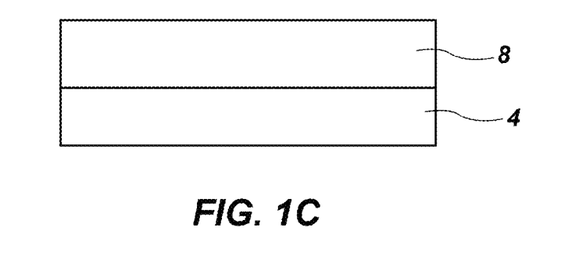

The metal may be formed on the substrate by conventional techniques, which are not described in detail herein. The metal may be formed at a thickness of from approximately 50 Å to approximately 100 µm, such as from approximately 5 nm to approximately 100 nm. As shown in FIG. 1A, a metal feature 2 may be the metal element, which is formed on a base material 4. Before exposing the metal feature 2 to a solution 6, metal oxides or other materials may be removed from a surface of the metal feature 2, such as by conventional techniques. By way of example, if the metal feature 2 is formed from copper, a conventional copper cleaning process may be used to remove copper oxide from a surface of the copper. As shown in FIG. 1B, the metal feature 2 may be contacted with the solution 6. The metal feature 2 may be immersed in the solution 6 for an amount of time sufficient for the chalcogenide element to incorporate into the metal feature 2. The metal feature 2 may be exposed to the solution 6 at room temperature (approximately 20° C. to approximately 25° C.), or at a lower or higher temperature, such as up to approximately 95° C., if a lower or higher reaction rate between the metal and chalcogenide element is desired. The metal feature 2 may be immersed in a bath containing the solution 6, or the solution 6 may be sprayed, spin-coated, or otherwise applied onto the metal feature 2. During exposure, the chalcogenide element may react with the metal of the metal feature 2 in a displacement reaction to form a metal chalcogenide material 8, as shown in FIG. 1C. Thus, the metal chalcogenide material 8 may be formed by an immersion plating process with diffusion of the chalcogenide element into the metal. Electron transfer from the chalcogenide element to the metal may enable formation of the metal chalcogenide material 8. As the chalcogenide element gains electrons, some of the metal may leave the metal feature 2 and form a soluble metal or metal compound in the solution 6. In some embodiments, CuTe is formed on a substrate by incorporating tellurium into copper. The copper is exposed to a solution including $TeO_2$ and HCl, or $TeO_2$ and $H_2SO_4$.

The length of exposure to the solution 6 may determine the thickness, composition, and physical properties of the metal chalcogenide material 8. The degree of incorporation of the chalcogenide element into the metal may be affected by the concentration of chalcogenide element in the solution 6, concentration of acid in the solution 6, temperature and pressure at which the process is conducted, the thickness of the metal feature 2, and the exposure time to the solution 6. Solutions 6 having a higher concentration of the chalcogenide element (i.e., the chalcogenide element source compound) may be used to form the metal chalcogenide material 8 having a higher amount of the chalcogenide element. Decreasing the thickness of the metal feature 2 may also form the metal chalcogenide material 8 having a greater amount of the chalcogenide element compared to that of a thicker metal feature 2. Increasing the exposure time of the metal feature 2 to the solution 6 may also form the metal chalcogenide material 8 having a greater amount of the chalcogenide element and at a greater thickness. Thus, by appropriately selecting the thickness of the metal feature 2, the concentration of the chalcogenide element in the solution 6, the concentration of acid in the solution 6, the temperature and pressure conditions, or the exposure time, complete conversion of the metal to the metal chalcogenide material 8 may be achieved.

The resulting metal chalcogenide material 8 may be a glassy material that includes the metal and the chalcogenide element in which the metal and the chalcogenide element are bonded to one another. In some embodiments, the metal chalcogenide material 8 includes microsegregated areas of the chalcogenide element or of the metal. In another embodiment, the metal chalcogenide material 8 includes a greater proportion of the metal relative to the chalcogenide element. Thus, the metal chalcogenide material 8 may be characterized as "rich" in the metal.

A crystal structure of the metal chalcogenide material 8 may depend on the amount of chalcogenide element incorporated into the metal and also on the acid used in the solution 6. By way of example, a first crystal structure of the metal chalcogenide material 8 may be produced using HCl as the acid in the solution 6 while a second crystal structure of the metal chalcogenide material 8 may be produced using $H_2SO_4$ as the acid. The crystal structure of the metal chalcogenide material 8 may further be tailored using a combination of acids in the solution 6. Thus, the crystal structure of the metal chalcogenide material 8 may be tailored by appropriately selecting the acid of the solution 6. The crystal structure may also affect the thickness of the resulting metal chalcogenide material 8. For instance, if large crystals of the metal chalcogenide material 8 are produced, the metal chalcogenide material 8 may be a greater thickness than the thickness of the metal feature 2 from which the metal chalcogenide material 8 is formed. Similarly, if small crystals of the metal chalcogenide material 8 are produced, the metal chalcogenide material 8 may be approximately the same thickness as the thickness of the metal feature 2 from which the metal chalcogenide material 8 is formed.

A method of forming a metal chalcogenide material is disclosed, the method comprising exposing a metal to a solution comprising a chalcogenide element source compound and an acid.

Figure 2A:
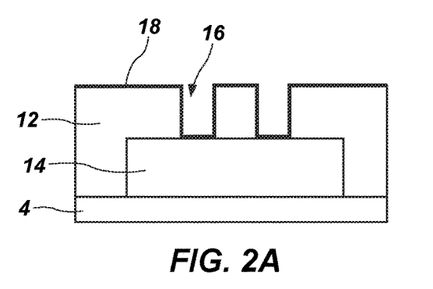
FIG. 2A-2F illustrate an embodiment of a method of forming a memory cell according to the present disclosure.
Figure 2B:
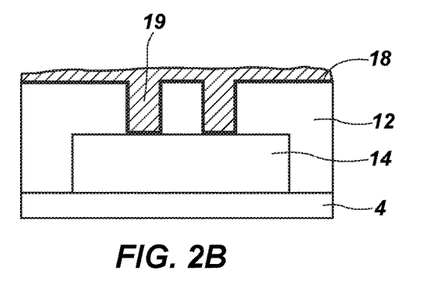
Figure 2C:
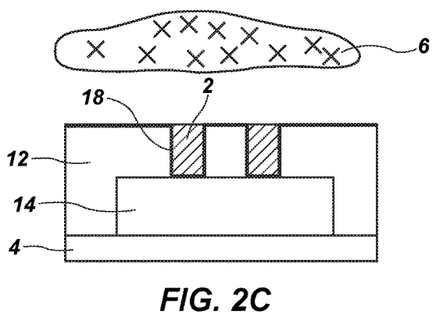
Figure 2D:
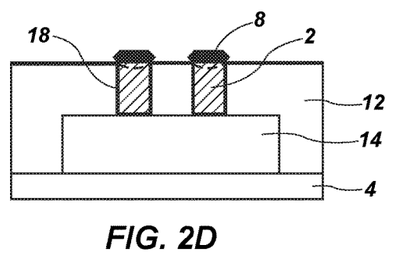
Figure 2E:
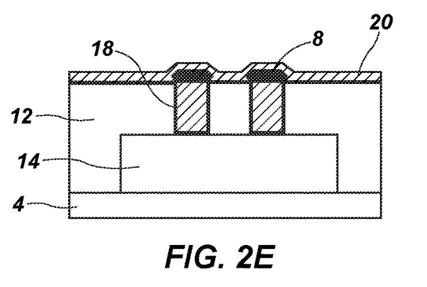
Figure 2F:
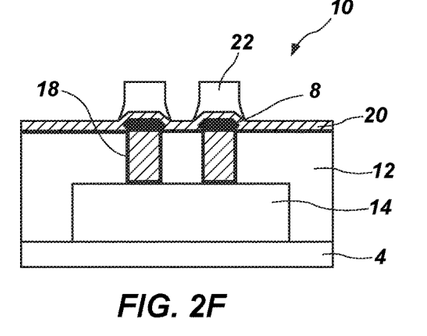

Some embodiments of the present disclosure may be used to form the metal chalcogenide material 8 in vias in a dielectric material. The metal chalcogenide material 8 may fill vias formed in the dielectric material. As shown in FIG. 2A-2F, a memory cell 10 including the metal chalcogenide material 8 may be formed. A dielectric material 12 may be formed on a bottom electrode 14 with vias 16 formed in the dielectric material 12, as shown in FIG. 2A. The dielectric material 12 may include, but is not limited to, silicon oxide, silicon nitride, silicon carbide, silicon carbide nitride, silicon carbide nitride oxide, or silicon nitride oxide. The bottom electrode 14 and vias 16 may be formed from conventional materials and by conventional techniques, which are not described in detail herein. A diffusion barrier 18 may be conformally formed over the dielectric material 12 and in the vias 16 by conventional techniques. The diffusion barrier 18 may be formed from a material that prevents diffusion of a metal into the dielectric material 12 such as, for example, tantalum. The vias 16 may be filled with a metal 19, as shown in FIG. 2B. The metal 19 may be deposited by conventional techniques, which are not described in detail herein. By way of example, the metal 19 may be deposited by ALD, CVD, PVD, electrochemical, electrolessly, or by other conventional techniques. Isolation of the vias 16 may be accomplished by conventional processing techniques, such as by chemical mechanical planarization (CMP). Since techniques for selectively depositing the metal 19 are known, the metal feature 2 may be deposited selectively. Thus, metal chalcogenide material 8 may be selectively formed by incorporating the chalcogenide element into the metal 19. Any metal 19 overlying the dielectric material 12 may be removed, such as by CMP, forming metal features 2, as shown in FIG. 2C, and isolating the vias 16. The metal features 2 may be immersed in the solution 6 including the chalcogenide element source compound, such as $TeO_2$, and the acid, such as HCl, $H_2SO_4$, or combinations thereof. The metal feature 2 may be exposed to the solution 6 to form the metal chalcogenide material 8, as shown in FIG. 2D. The exposure time to the solution 6 may be sufficient for the chalcogenide element to incorporate into and react with the metal 19, forming the metal chalcogenide material 8. The chalcogenide element may incorporate selectively into the metal 19 of the metal feature 2. Thus, although the solution 6 contacts the dielectric material 12 and diffusion barrier 18 as well as the metal feature 2, the chalcogenide element may selectively react with the metal of the metal feature 2. While FIG. 2D shows a bottom surface of the metal chalcogenide material 8 as being substantially coplanar with a top surface of the dielectric material 12, the bottom surface of the metal chalcogenide material 8 may, optionally, extend into the metal feature 2, as indicated in FIG. 2D by dashed lines, depending on the exposure time and the concentration of the chalcogenide element in the solution 6. A cell oxide 20 may be formed over the dielectric material 12 and the metal chalcogenide material 8, as shown in FIG. 2E. Top electrodes 22 may then be formed over the cell oxide 20, as shown in FIG. 2F. The cell oxide 20 and the top electrodes 22 may be formed by conventional techniques, which are not described in detail herein. By way of example, a CuTe memory cell may be formed as described above using copper in the metal feature 2 and a solution including $TeO_2$ and HCl, $H_2SO_4$, or combinations thereof.

A method of forming a memory cell is disclosed, the method comprising forming a plurality of vias in a dielectric material. A metal is formed in the plurality of vias and the metal is exposed to a solution comprising a chalcogenide element source compound and an acid to form a metal chalcogenide material. A cell oxide is formed over the metal chalcogenide material and the dielectric material.

Figure 3A:
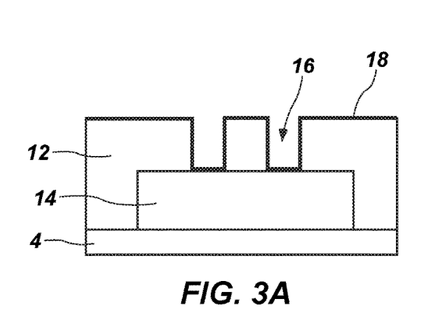
FIG. 3A-3F illustrate another embodiment of a method of forming a memory cell according to the present disclosure.
Figure 3B:
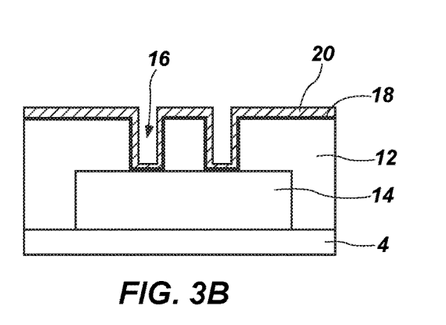
Figure 3C:
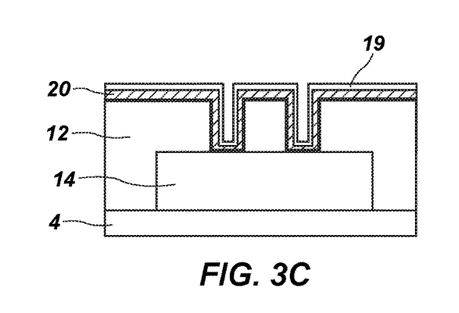
Figure 3D:
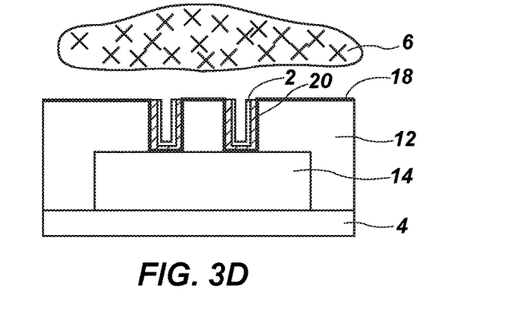
Figure 3E:
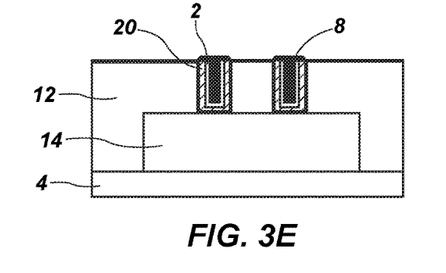
Figure 3F:
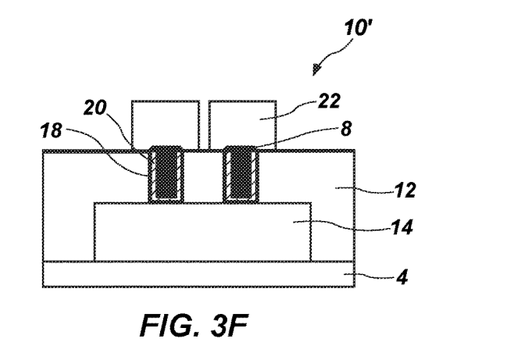

As shown in FIG. 3A-3F, a memory cell 10' including the metal chalcogenide material 8 is formed. The dielectric material 12 is formed on the bottom electrode 14 with vias 16 formed in the dielectric material 12, as shown in FIG. 3A. The bottom electrode 14 and vias 16 may be formed from conventional materials and by conventional techniques, which are not described in detail herein. As shown in FIG. 3B, the cell oxide 20 may be conformally formed over the dielectric material 12 and in the vias 16 by conventional techniques. The metal 19 may be conformally formed over the cell oxide 20, including in the vias 16, as shown in FIG. 3C, also by conventional techniques. The metal 19 may be formed as a seed, such as a seed of copper. The metal 19 may be formed by PVD or ALD. The cell oxide 20 and portions of the metal 19 overlying the dielectric material 12 may be removed, such as by CMP, to form the metal features 2, as shown in FIG. 3D. The metal feature 2 may be immersed in the solution 6 including the chalcogenide element source compound, such as $TeO_2$, and the acid, such as HCl, $H_2SO_4$, or combinations thereof. The metal feature 2 may be exposed to the solution 6 to form the metal chalcogenide material 8 in the vias 16, as shown in FIG. 3E. The exposure time to the solution 6 may be sufficient for the chalcogenide element to incorporate into and react with the metal, forming the metal chalcogenide material 8. Although the solution 6 contacts the dielectric material 12 and diffusion barrier 18 as well as the metal feature 2, the chalcogenide element may selectively react with the metal 19 of the metal feature 2. The top electrodes 22 may be formed over the metal chalcogenide material 8, as shown in FIG. 3F. By way of example, a CuTe memory cell may be formed as described above using copper as the metal feature 2 and a solution including $TeO_2$ and HCl, $H_2SO_4$, or combinations thereof.

A method of forming a memory cell is disclosed, the method comprising forming a plurality of vias in a dielectric material. A cell oxide is formed in the plurality of vias and a metal is formed in the plurality of vias. The metal is exposed to a solution comprising a chalcogenide element source compound and an acid.

Another method of forming a memory cell is disclosed, the method comprising forming a metal in a dielectric material. The metal is exposed to a solution comprising a chalcogenide element source compound and an acid to form a metal chalcogenide material. A cell oxide is formed over the metal chalcogenide material and the dielectric material.

While the embodiment illustrated in FIGS. 3A-3F shows that the metal chalcogenide material 8 fills the vias 16 and forms over a portion of the metal feature 2 and cell oxide 20, depending on the exposure time and the chalcogenide element concentration in the solution 6, the metal chalcogenide material 8 may partially fill the vias 16. If the vias 16 are partially filled with the metal chalcogenide material 8, the top electrodes 22 may be formed to extend into the vias 16 and contact the metal chalcogenide material 8.

While FIGS. 1A-3F are described above in reference to forming CuTe, a binary compound, as the metal chalcogenide material 8, other metal chalcogenide materials 8 may be formed in a similar manner. If an additional element(s) is present in the metal chalcogenide material, (i.e., if a ternary compound or quaternary compound is to be formed), the additional element may be selected to be compatible with the redox potential between the metal and the chalcogenide element. To incorporate the additional element into the metal, a source compound of the additional element may be added to the solution 6. The source compound of the additional element may be at least partially soluble in the solution 6. The additional element may diffuse into the metal as described above in regard to the diffusion of the chalcogenide element into the metal.

By forming the metal chalcogenide material 8 according to embodiments of the present disclosure, the metal chalcogenide material 8 may be formed by a less expensive, less time consuming, and less complex process. The methods of the present disclosure do not utilize evacuated deposition or target materials, which reduces their complexity. In addition, the metal chalcogenide material 8 may be selectively formed by incorporating the chalcogenide element into locations where the metal is present. Thus, methods of the present disclosure enable the selective formation of the metal chalcogenide material 8. The memory cells 10, 10' including the metal chalcogenide material 8 may be used in memory devices for wireless devices, personal computers, or other electronic devices.

The following examples serve to explain embodiments of the present invention in more detail. These examples are not to be construed as being exhaustive or exclusive as to the scope of this invention.

EXAMPLE 1

Effect of Acid on CuTe Crystal Structure

Figure 4A:
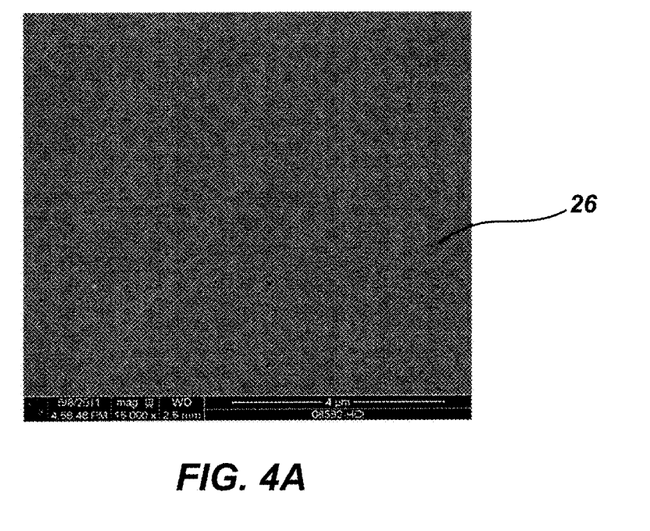
FIGS. 4A and 4B are scanning electron micrographs (SEMs) of CuTe materials formed according to embodiments of the present disclosure.
Figure 4B:
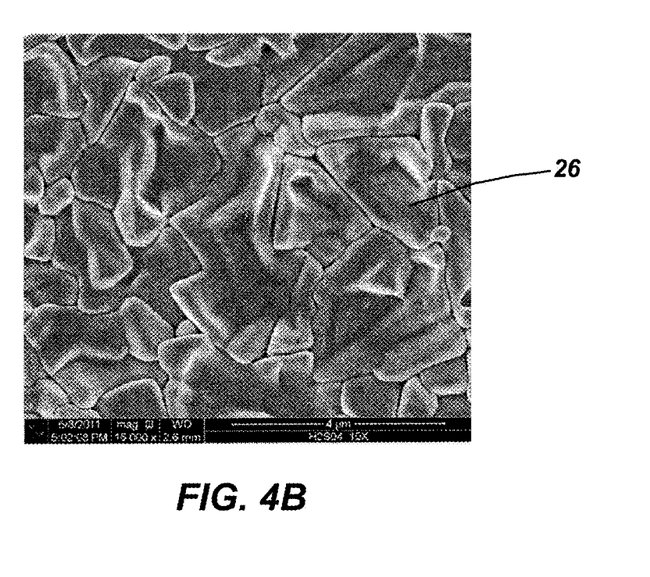

The crystal structures of films of CuTe formed by embodiments of the present disclosure depend on the acid used in the solution 6. As shown in FIGS. 4A and 4B, a CuTe film 26 produced using $H_2SO_4$ (FIG. 4B) as the acid had larger crystals compared to the CuTe film 26 produced using HCl (FIG. 4A) as the acid. All other parameters for forming the CuTe 26 films were the same, including exposure time, temperature, $TeO_2$ concentration, and acid concentration.

EXAMPLE 2

Effect of Exposure Time on CuTe Formation

Figure 5A:
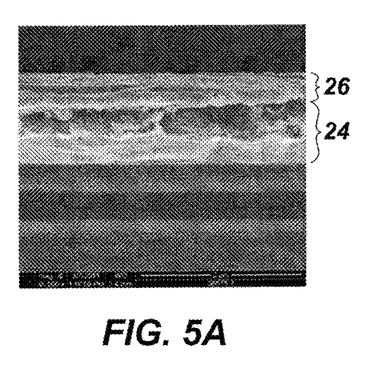
FIGS. 5A and 5B are scanning electron micrographs (SEMs) of CuTe materials formed according to an embodiment of the present disclosure.
Figure 5B:
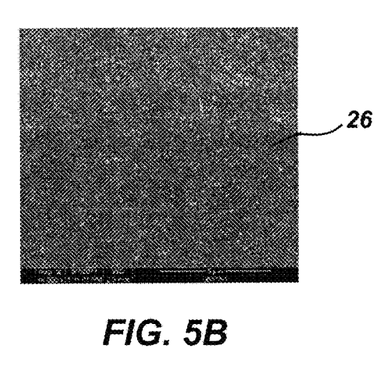
Figure 6A:
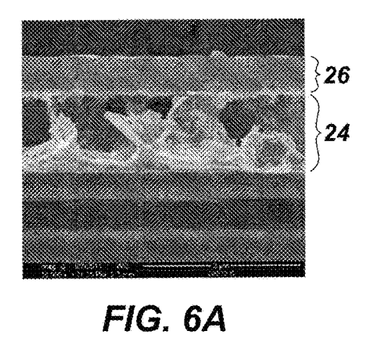
FIGS. 6A and 6B are SEMs of CuTe materials formed according to an embodiment of the present disclosure.
Figure 6B:
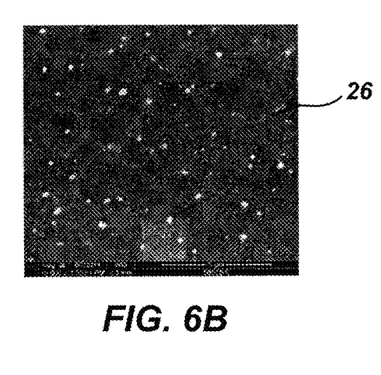

A copper material 24 on a substrate was exposed to a solution 6 including 1 mM $TeO_2$ and HCl. The pH of the solution was adjusted to 2.0 using the HCl. After 1 minute, approximately 150 nm of CuTe film 26 had formed on the copper material 24 as shown in FIG. 5A, which is a cross-sectional view of the copper material 24 and CuTe film 26. FIG. 5B is a top down view of the CuTe film 26 of FIG. 5A. The thickness of the CuTe film 26 increased to approximately 500 nm after 5 minutes of exposure to the solution 6, as shown in FIG. 6A, which is a cross-sectional view of the copper material 24 and CuTe film 26. FIG. 6B is a top down view of the CuTe film 26 of FIG. 6A.

Figure 7A:
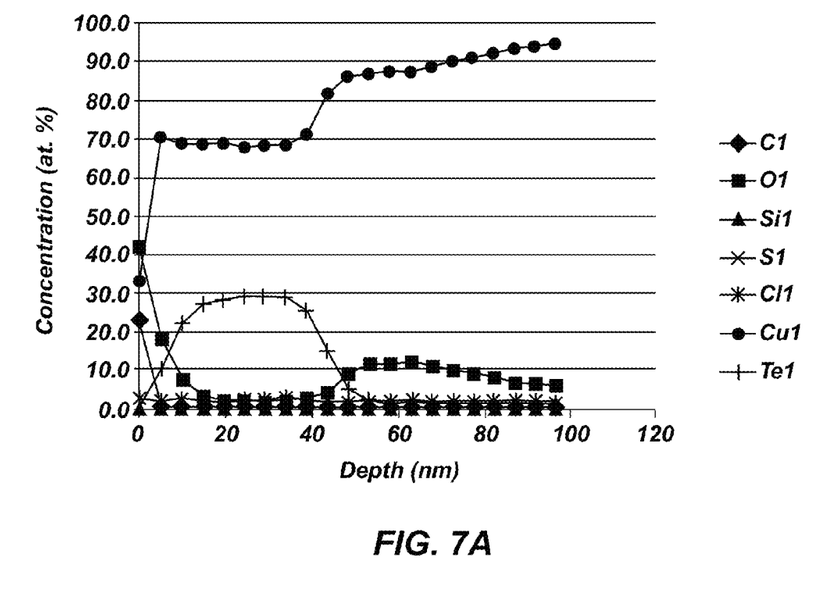
FIGS. 7A and 7B are XPS (x-ray photoelectron spectroscopy) depth profiles for CuTe materials formed according to embodiments of the present disclosure.
Figure 7B:
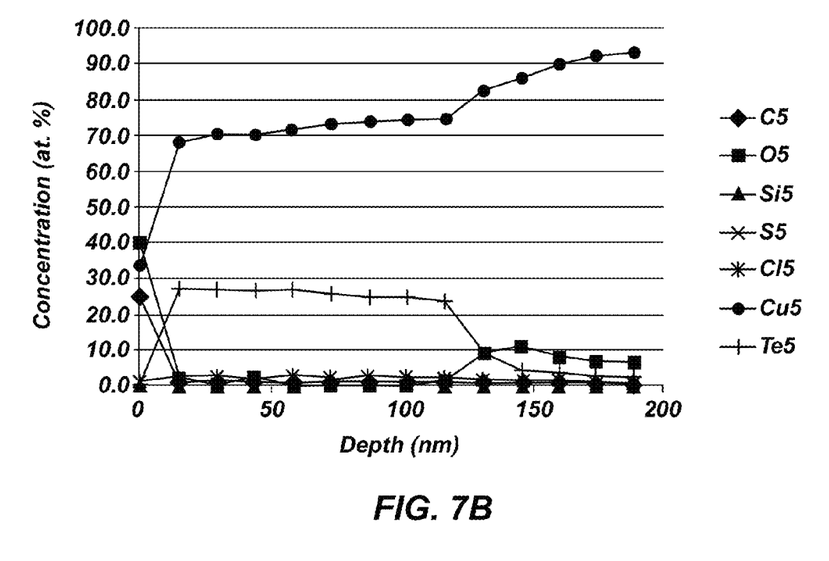

The XPS (x-ray photoelectron spectroscopy) depth profiles for the CuTe film 26 at 1 minute (FIG. 7A) and 5 minutes (FIG. 7B) confirmed that tellurium was incorporated at a greater depth into the copper material 24 over time. After 5 minutes of exposure, about 22 at. % of tellurium was detected at a depth of over 100 nm while about 25 at. % of tellurium was detected at a depth at 40 nm after 1 minute.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a metal chalcogenide material, comprising:

exposing a metal to a solution comprising a chalcogenide element source compund, an acid, and water, the chalcogenide element source compound comprising tellurium trioxide ($TeO_3$), tellurium tetrachloride ($TeCl_4$), or selenium trioxide ($SeO_3$), and reacting the metal and the solution at a temperature of from approximately 20° C. to approximately 25° C. to form a binary metal telluride material or a binary metal selenide material on the metal.

2. The method of claim 1, wherein exposing a metal to a solution comprising a chalcogenide element source compound, an acid, and water comprises exposing the metal to a solution having a pH of less than approximately 7.0.

3. The method of claim 1, wherein exposing a metal to a solution comprising a chalcogenide element source compound, an acid, and water comprises exposing the metal to a solution comprising water, a chalcogenide element source compound, and an acid selected from the group consisting of hydrochloric acid (HCl), sulfuric acid ($H_2SO_4$), hydrogen fluoride (HF), hydrogen iodide (HI), hydrogen bromide (HBr), perchloric acid ($HClO_4$), nitric acid ($HNO_3$), chloric acid ($HClO_3$), and combinations thereof.

4. The method of claim 1, wherein exposing a metal to a solution comprising a chalcogenide element source compound, an acid, and water comprises exposing a metal feature consisting of a Group 11 element to the solution.

5. A method of forming a memory cell, comprising:
forming a plurality of vias in a dielectric material;
conformally forming an elemental metal over sidewalls of the dielectric material and over a bottom surface of the plurality of vias;
exposing the elemental metal to a solution comprising an acid and a tellurium element source or a selenium element source compound;
reacting the elemental metal and the solution at a temperature of from approximately 20° C. to approximately 25° C. to form a binary metal telluride material or a binary metal selenide material at least partially filling the plurality of vias; and
forming a cell oxide over the binary metal telluride material or the binary metal selenide material and the dielectric material.

6. The method of claim 5, wherein reacting the elemental metal and the solution at a temperature of from approximately 20° C. to approximately 25° C. to form a binary metal telluride material or a binary metal selenide material at least partially filling the plurality of vias comprises filling the plurality of vias with the binary metal telluride material or the binary metal selenide material.

7. The method of claim 5, wherein conformally forming an elemental metal over sidewalls of the dielectric material and over a bottom surface of the plurality of vias comprises conformally forming copper over the sidewalls of the dielectric material and over the bottom surface of the plurality of vias.

8. The method of claim 5, wherein exposing the elemental metal to a solution comprising an acid and a tellurium element source or a selenium element source compound comprises exposing the elemental metal to a solution comprising a tellurium element source or a selenium element source compound selected from the group consisting of tellurium dioxide ($TeO_2$), tellurium trioxide ($TeO_3$), selenium dioxide ($SeO_2$), and selenium trioxide ($SeO_3$) and an acid selected from the group consisting of hydrochloric acid (HCl), sulfuric acid ($H_2SO_4$), hydrogen fluoride (HF), hydrogen iodide (HI), hydrogen bromide (HBr), perchloric acid ($HClO_4$), nitric acid ($HNO_3$), chloric acid ($HClO_3$), and combinations thereof.

9. The method of claim 5, further comprising forming a bottom electrode below the elemental metal.

10. The method of claim 9, further comprising forming a plurality of top electrodes above the binary metal telluride material or the binary metal selenide material and the cell oxide.

11. The method of claim 5, wherein conformally forming an elemental metal over sidewalls of the dielectric material and over a bottom surface of the plurality of vias comprises forming a Group 11 element over the sidewalls of the dielectric material and over the bottom surface of the plurality of vias.

12. The method of claim 5, wherein reacting the elemental metal and the solution at a temperature of from approximately 20° C. to approximately 25° C. to form a binary metal telluride material or a binary metal selenide material comprises forming the binary metal telluride material or the binary metal selenide material selectively on the elemental metal.

13. The method of claim 5, wherein exposing the elemental metal to a solution comprising reacting the elemental metal and the solution at a temperature of from approximately 20° C. to approximately 25° C. to form a binary metal telluride material or a binary metal selenide material at least partially filling the plurality of vias comprises incorporating tellurium or selenium of the tellurium element source compound or a selenium element source compound into the elemental metal.

14. A method of forming a memory cell, comprising:
forming a plurality of vias in a dielectric material;
forming a cell oxide in the plurality of vias;
conformally forming an elemental metal over sidewalls of the dielectric material and over a bottom surface of the plurality of vias;
exposing the elemental metal to a solution comprising an acid and a tellurium element source compound or a selenium element source compound; and
reacting the elemental metal and the solution at a temperature of from approximately 20° C. to approximately 25° C. to form a binary metal telluride material or a binary metal selenide material at least partially filling the plurality of vias.

15. The method of claim 14, wherein conformally forming an elemental metal over sidewalls and over a bottom surface of the plurality of vias comprises conformally forming an elemental metal seed layer over the sidewalls and over the bottom surface of the plurality of vias.

16. The method of claim 14, wherein reacting the elemental metal and the solution at a temperature of from approximately 20° C. to approximately 25° C. to form a binary metal telluride material or a binary metal selenide material at least partially filling the plurality of vias comprises forming the binary metal telluride material or the binary metal selenide material to fill the plurality of vias.

17. The method of claim 14, further comprising forming a plurality of top electrodes in contact with the binary metal telluride material or the binary metal selenide material.

18. A method of forming a memory cell, comprising:
forming vias in a dielectric material;
conformally forming an elemental metal over sidewalls and upper surfaces of the dielectric material and over bottom surfaces of the vias;
forming metal features in the vias;

exposing the metal features and the elemental metal on the upper surfaces of the dielectric material to a solution comprising a chalcogenide element source compound and an acid at a temperature of from approximately 20° C. to approximately 25° C. to form a binary metal chalcogenide material on the metal features without forming the binary metal chalcogenide material on the elemental metal on the upper surfaces of the dielectric material; and forming a cell oxide over the metal chalcogenide material and the elemental metal.

\* \* \* \* \*

UNITED STATES PATENT AND TRADEMARK OFFICE
CERTIFICATE OF CORRECTION

PATENT NO. : 9,573,809 B2  Page 1 of 1
APPLICATION NO. : 13/435216
DATED : February 21, 2017
INVENTOR(S) : Chet E. Carter It is certified that error appears in the above-identified patent and that said Letters Patent is hereby corrected as shown below:

In the Specification

Column 1, Line 23, change "(CBRAIVI)" to --(CBRAM)--

In the Claims

Claim 1, Column 9, Line 2, change "source compund," to --source compound,--

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*